US009550633B2

United States Patent
Tsunoda et al.

(10) Patent No.: US 9,550,633 B2
(45) Date of Patent: Jan. 24, 2017

(54) LEVITATION AIR PLATE

(71) Applicant: Oiles Corporation, Tokyo (JP)

(72) Inventors: Kouichi Tsunoda, Kanagawa (JP); Akihiko Ito, Kanagawa (JP); Takahiro Yasuda, Kanagawa (JP); Hideo Ozawa, Kanagawa (JP)

(73) Assignee: Oiles Corporation, Tokyo (JP)

( * ) Notice: Subject to any disclaimer, the term of this patent is extended or adjusted under 35 U.S.C. 154(b) by 0 days.

(21) Appl. No.: 15/210,642

(22) Filed: Jul. 14, 2016

(65) Prior Publication Data

US 2016/0318719 A1    Nov. 3, 2016

Related U.S. Application Data

(62) Division of application No. 14/389,963, filed as application No. PCT/JP2013/057967 on Mar. 21, 2013, now Pat. No. 9,422,120.

(30) Foreign Application Priority Data

Apr. 3, 2012  (JP) .................................. 2012-084409
Mar. 19, 2013  (JP) .................................. 2013-055853

(51) Int. Cl.
B65G 53/00    (2006.01)
B65G 49/06    (2006.01)
B65G 51/03    (2006.01)

(52) U.S. Cl.
CPC ............. B65G 49/065 (2013.01); B65G 51/03 (2013.01)

(58) Field of Classification Search
CPC .... B65G 53/02; B65G 51/03; H01L 21/67784
(Continued)

(56) References Cited

U.S. PATENT DOCUMENTS 4,299,518 A  *  11/1981  Whelan ............... H01L 21/6779
                                                    406/62
5,611,648 A  *   3/1997  Lenhart .................. B65G 51/03
                                                    406/88
(Continued)

FOREIGN PATENT DOCUMENTS

JP    2001199528 A    7/2001
WO    WO0247155       6/2002

OTHER PUBLICATIONS

ISR and Written Opinion for PCT/2013/057967 issued on May 21, 2013.

*Primary Examiner* — Joseph Dillon, Jr.
(74) *Attorney, Agent, or Firm* — Stetina Brunda Garred and Brucker; Mark B. Garred

(57) ABSTRACT

To provide a levitation air plate that can be easily manufactured and can float a substance being conveyed such as a glass while maintaining its high rigidity and controlling a floating amount in high accuracy. A levitation air plate 1 provided with: a top plate 2 in which a plurality of air ejection holes 2c and suction holes 2d penetrating from an upper surface 2a to a lower surface 2b are arranged in alternating fashion as viewed from the upper surface, the top plate 2 having a counter-bored portion 2e on the lower surface side of each of the plurality of air ejection holes; an orifice sheet 3 having a plurality of orifices 3c penetrating from an upper surface 3a to a lower surface 3b in positions corresponding to the counter-bored portions of the top plate, and having communicating holes 3d communicated one-to-one with the suction holes of the top plate and penetrating from the upper surface to the lower surface; and bottom side plates 4, 5 having an air supply channel 4c and an air supply hole 5c for supplying air to all of the orifices drilled in the orifice sheet, and an air suction channel 4d and a suction hole
(Continued)

5*d* for suctioning air from all of the communicating holes communicated with the suction holes.

4 Claims, 12 Drawing Sheets

(58) Field of Classification Search
USPC .......... 406/88; 414/676; 108/50.13; 65/25.2, 65/182.2
See application file for complete search history.

(56) References Cited

U.S. PATENT DOCUMENTS

| | | | |
|---|---|---|---|
| 6,969,224 B2 * | 11/2005 | Miyachi | B65G 49/061 414/676 |
| 7,269,475 B1 | 9/2007 | Hogg et al. | |
| 7,393,159 B2 | 7/2008 | Chang et al. | |
| 7,530,778 B2 | 5/2009 | Yassour et al. | |
| 7,604,439 B2 | 10/2009 | Yassour et al. | |
| 7,908,995 B2 | 3/2011 | Inamasu et al. | |
| 8,191,227 B2 | 6/2012 | Brackley et al. | |
| 8,256,370 B2 | 9/2012 | Kitano et al. | |
| 2006/0284042 A1 * | 12/2006 | Ahn | B65G 51/03 248/349.1 |
| 2011/0023757 A1 | 2/2011 | Richman et al. | |
| 2013/0130510 A1 * | 5/2013 | Bok | H01L 21/677 438/758 |
| 2015/0239682 A1 | 8/2015 | Wang et al. | |

\* cited by examiner

Fig. 1
1
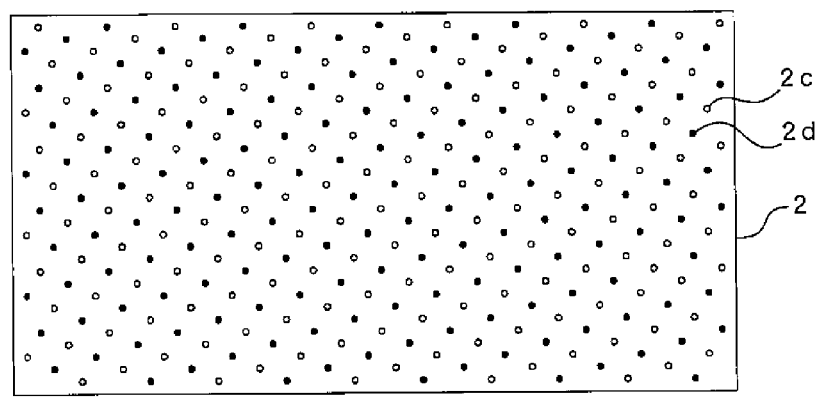
(b)
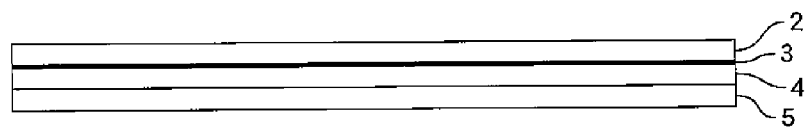
(a)
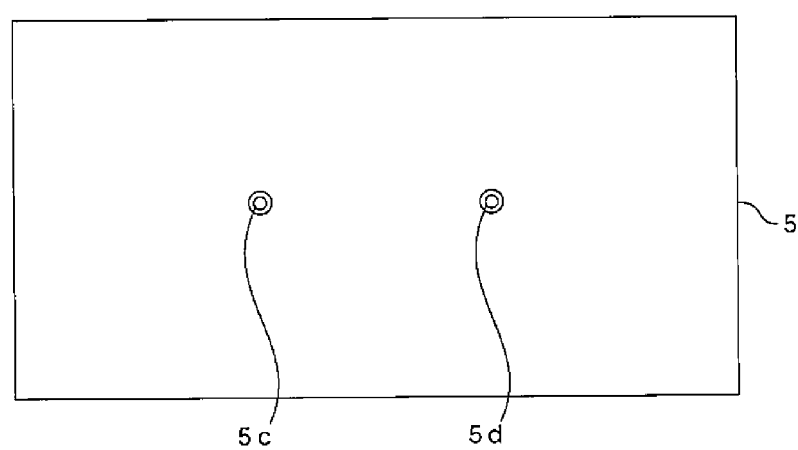
(c)

Fig. 5
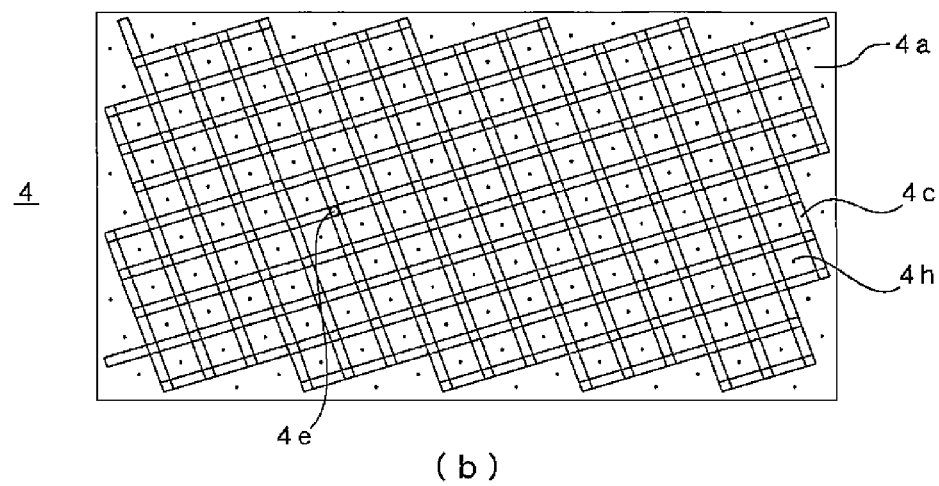
(b)
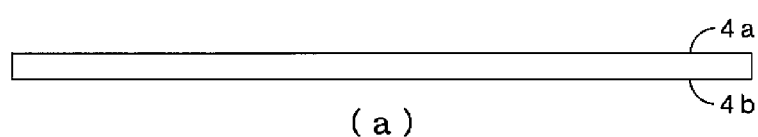
(a)
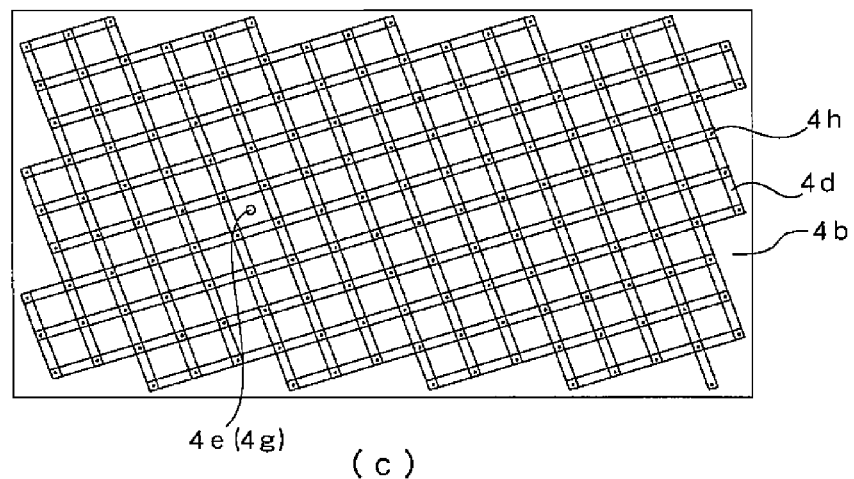
(c)
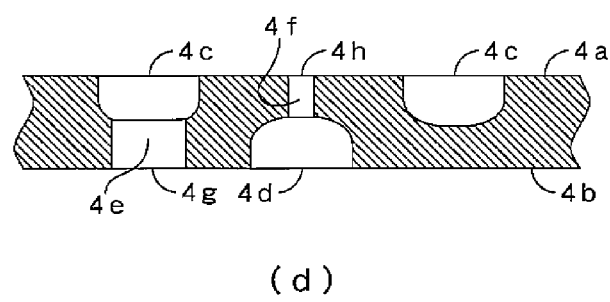
(d)

(a)

(b)

Fig. 9
21
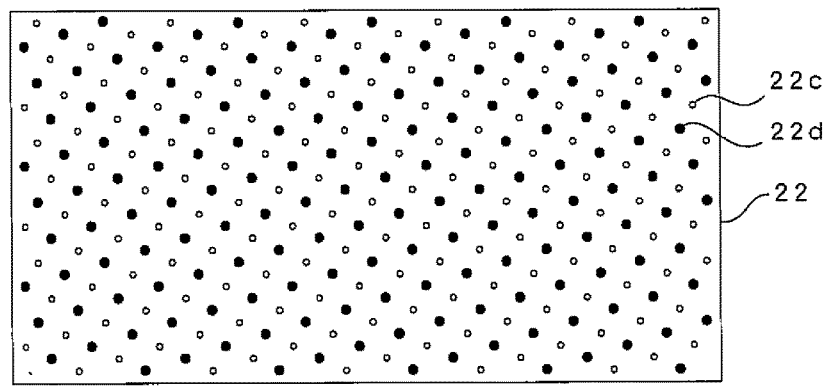
(b)
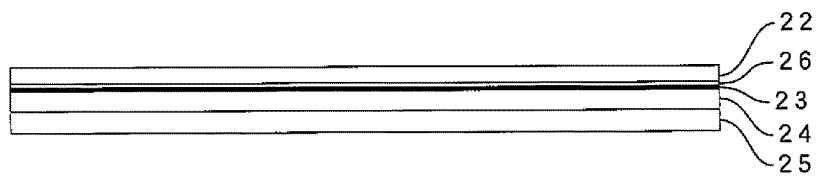
(a)
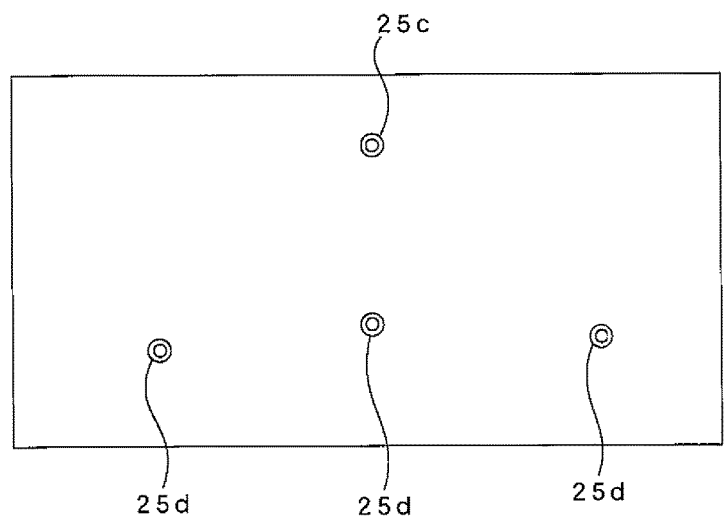
(c)

(a)

(b)

(a)

(b)

Fig. 14
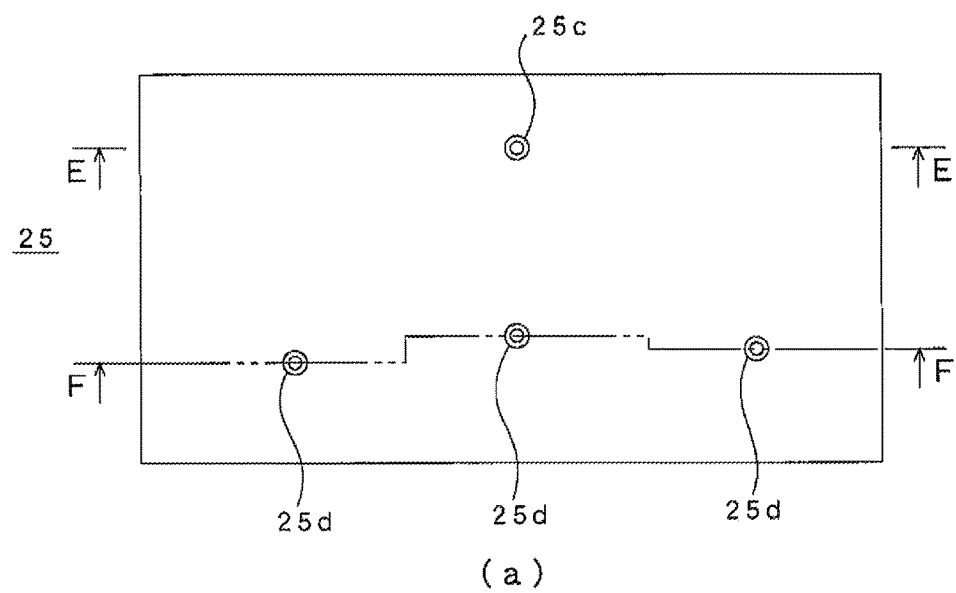
(a)
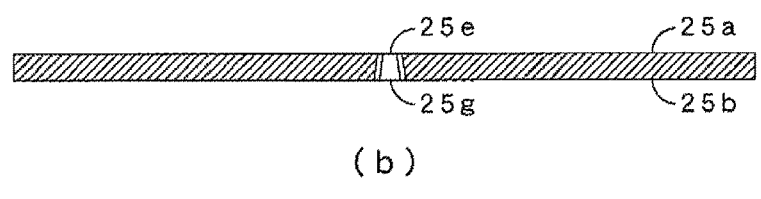
(b)
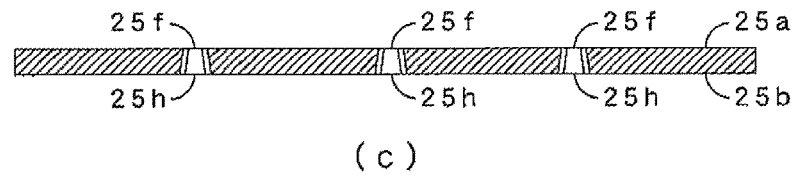
(c)

LEVITATION AIR PLATE

CROSS-REFERENCE TO RELATED APPLICATIONS

The present application is a divisional of U.S. application Ser. No. 14/389,963 filed Oct. 1, 2014, which claims priority to International Application No. PCT/JP2013/057967 filed on Mar. 21, 2013, which claims priority to Japanese Patent Application No. 2012-084409 filed Apr. 3, 2012 and Japanese Patent Application No. 2013-055853 filed Mar. 19, 2013.

STATEMENT RE: FEDERALLY SPONSORED RESEARCH/DEVELOPMENT

Not Applicable

BACKGROUND OF THE INVENTION

1. Technical Field of the Invention

The present invention relates to a levitation air plate, and more particularly to a levitation air plate used for noncontact conveying devices that produce flat panel displays (FPDs) such as large-scale liquid crystal displays (LCDs) and plasma displays (PDPs), solar cell panels (solar panels) and so on.

2. Description of the Related Art

When producing FPDs, solar panels and the like, a method of enlarging one panel to increase production efficiency is employed. Then, contact-type conveyors using conventional abacus-type rollers for conveying FPDs have disadvantages in conveying an enlarged glass with thin-wall while increasing velocity; minimizing stress; and conveying with floating amount maintained in high accuracy etc., so that noncontact and air-float conveying is desired.

This noncontact and air-float conveying generally ejects airs from plate-shaped boards to float a substance being conveyed such as a glass. In order to eject airs, there are a method of ejecting airs through fine pores of a porous material such as carbon and a method of drilling small holes through a thick plate with high rigidity to eject airs through these holes.

In processes of checking and coating circuit patterns drawn on a glass to be conveyed, it is necessary to maintain floating amount of the glass in high accuracy. Therefore, it is required a method of floating the glass while maintaining its high rigidity to straighten warpage of the glass.

Conventionally, in order to float and hold a glass or the like while maintaining its high rigidity, combining hydrostatic air bearings of porous body with throttles and suction holes is proposed. But, it is difficult to manufacture a large-scale structure of porous body with throttles in high accuracy, so that a large-scale, for example, 2 m×2 m-level product was not realized. In addition, to manufacture air bearings of the type that many small holes are drilled in a thick plate with high rigidity, there is a problem that enormous time and expenses are needed.

Then, the present invention has been made in consideration of the above problems in the conventional levitation air plates, and the object thereof is to provide a levitation air plate that can be easily manufactured and can float a substance being conveyed such as a glass while maintaining its rigidity and controlling a floating amount in high accuracy.

BRIEF SUMMARY OF THE INVENTION

In order to attain the above-mentioned object, the present invention relates to a levitation air plate, and the plate is characterized by comprising: a top plate in which a plurality of air ejection holes and suction holes penetrating from an upper surface to an lower surface thereof are arranged in alternating fashion as viewed from the upper surface, the top plate having a counter-bored portion on the lower surface side of each of the plurality of air ejection holes; an orifice sheet having a plurality of first orifices penetrating from an upper surface to an lower surface thereof in positions corresponding to the counter-bored portions of the top plate, and having communicating holes communicated one-to-one with the suction holes of the top plate and penetrating from the upper surface to the lower surface; and a bottom side plate having an air supply route and an air supply hole for supplying air to all of the first orifices drilled in the orifice sheet, and having an air suction route and a suction hole for suctioning air from all of the communicating holes communicating with the suction holes.

With the present invention, airs ejected from the first orifices drilled in the orifice sheet collide with the counter-bored portions of the top plate, and are blown upward from the air ejection holes with lowered speed to float a glass or the like positioned above in noncontact state while maintaining its high rigidity. Further, arranging a plurality of air ejection holes and suction holes in alternating fashion allows the balance between pressures of the ejected airs and pressures of the sucked airs to accurately be adjusted, which allows floatation amount of the substance being conveyed to be controlled in high accuracy.

In the above levitation air plate, the bottom side plate may be composed of an air route plate and a bottom plate, and on an upper surface of the air route plate is provided air ejecting channel portions that communicate with all of the first orifices drilled in the orifice sheet and suction openings that communicate one-to-one with the communicating holes of the orifice sheet; on a lower surface of the air route plate is provided suction channel portions that communicate with all of the communicating holes communicating with the suction openings and a communicating hole that opens on the lower surface and communicates with the air ejecting channel portions, and a bottom plate is provided with an air supply hole and a suction hole that penetrate from an upper surface to an lower surface thereof; an opening portion on an upper surface side of the air supply hole communicates with the communicating hole communicating with the air ejecting channel portions of the air route plate; and an opening portion on the upper surface side of the suction hole communicates with the suction channel portions of the air route plate. With this, the air ejecting route and the air sucking route are easily manufactured, resulting in further reduced production cost.

In the above levitation air plate, in place of the communicating holes, a plurality of second orifices penetrating from the upper surface to the lower surface thereof in positions corresponding to the suction holes of the top plate can be applied. With this construction, to airs to be sucked also can be displayed throttling effect, which suppresses changes in suction force.

In addition, the present invention relates to a levitation air plate, and the plate is characterized by comprising: a top plate in which a plurality of air ejection holes and suction holes penetrating from an upper surface to an lower surface thereof are arranged in alternating fashion as viewed from the upper surface; a seating face sheet having communicating holes communicated one-to-one with the air ejection holes and the suction holes of the top plate, and penetrating from an upper surface to a lower surface thereof, and whose diameters are larger than diameters of the air ejection holes and suction holes; an orifice sheet having a plurality of first orifices penetrating from an upper surface to a lower surface thereof in positions corresponding to the communicating holes of the seating face sheet communicated with the air ejection holes of the top plate, and having a plurality of second orifices penetrating from the upper surface to the lower surface thereof in positions corresponding to the communicating holes of the seating face sheet communicated with the suction holes of the top plate, a bottom side plate having an air supply route and an air supply hole for supplying air to all of the first orifices drilled in the orifice sheet, and having an air suction route and a suction hole for suctioning air from all of the second orifices drilled in the orifice sheet. With this invention, like the above invention, a glass or the like positioned above can be floated in a noncontact state while maintaining its high rigidity, and controlling floatation amount of the substance being conveyed in high accuracy.

Further, the communicating holes of the seating face sheet form the counter-bored portions, which are provided with the seating face sheet other than the top plate, which can increase accuracy of counter-boring; obtain uniform depth of the counter-bores; and perform the counter-boring with ease.

In the above levitation air plate, the bottom side plate can be composed of an air route plate and a bottom plate, and on an upper surface of the air route plate is provided air ejecting channel portions that communicate with all of the first orifices drilled in the orifice sheet and suction openings that communicate with all of the second orifices drilled in the orifice sheet; on a lower surface of the air route plate is provided suction channel portions that communicate with all of the communicating holes communicating with the suction openings and a communicating hole that opens on the lower surface and communicates with the air ejecting channel portions, and the bottom plate is provided with an air supply hole and a suction hole that penetrate from an upper surface to an lower surface thereof; an opening portion on the upper surface side of the air supply hole communicates with the communicating hole communicating with the air ejecting channel portions of the air route plate; and an opening portion on the upper surface side of the suction hole communicates with the suction channel portions of the air route plate. With this, the air ejecting route and the air sucking route are easily manufactured, resulting in further reduced production cost.

In the above levitation air plate, the air ejection holes and the suction holes of the top plate can be arranged in alternating fashion on a plurality of lines that never cross each other as viewed from the upper surface, and angles between the plurality of lines and a conveying direction by the levitation air plate can be other than 0°, 45° and 90°. With this construction, regardless of the positions in a direction vertical to the conveying direction, the air ejection holes and the suction holes are evenly disposed in the conveying direction, which allows a substance to stably be conveyed in noncontact state. In addition, when a substance being conveyed such as a glass is conveyed in a state that its temperature is high due to coating or the like, dead zones without ejection openings becomes small on the route that the substance moves, which can preferably performs uniform cooling of the substance.

In the above levitation air plate, each of the plurality of orifices of the orifice sheet is drilled by micropore processing with a laser. This enables the orifices to efficiently be drilled in a short period of time, resulting in further reduction in production cost.

As described above, with the present invention, it is possible to provide a levitation air plate that can be easily manufactured and can float a substance being conveyed such as a glass while maintaining its high rigidity and controlling a floating amount in high accuracy.

BRIEF DESCRIPTION OF THE DRAWINGS

FIG. 5 depicts an air route plate of the levitation air plate shown in FIG. 1, in which (a) is a front view, (b) is a top view, and (c) is a bottom view, and (d) is an enlarged cross-sectional view of air ejection channel portions and suction channel portions and their peripheries.

FIG. 9 depicts a levitation air plate according to the second embodiment of the present invention, in which (a) is a front view, (b) is a top view, and (c) is a bottom view.

FIG. 13 depicts an air route plate of the levitation air plate shown in FIG. 9, in which (a) is a front view, (b) is a top view, and (c) is a bottom view, and (d) is an enlarged cross-sectional view of air ejection channel portions and suction channel portions and their peripheries.

FIG. 14 depicts a bottom plate of the levitation air plate shown in FIG. 9, in which (a) is a top view, (b) is a cross-sectional view taken along the line E-E of (a), and (c) is a cross-sectional view taken along the line F-F of (a).

DETAILED DESCRIPTION OF THE INVENTION

Next, embodiments carrying out the present invention will be explained with reference to drawings.

Figure 1:
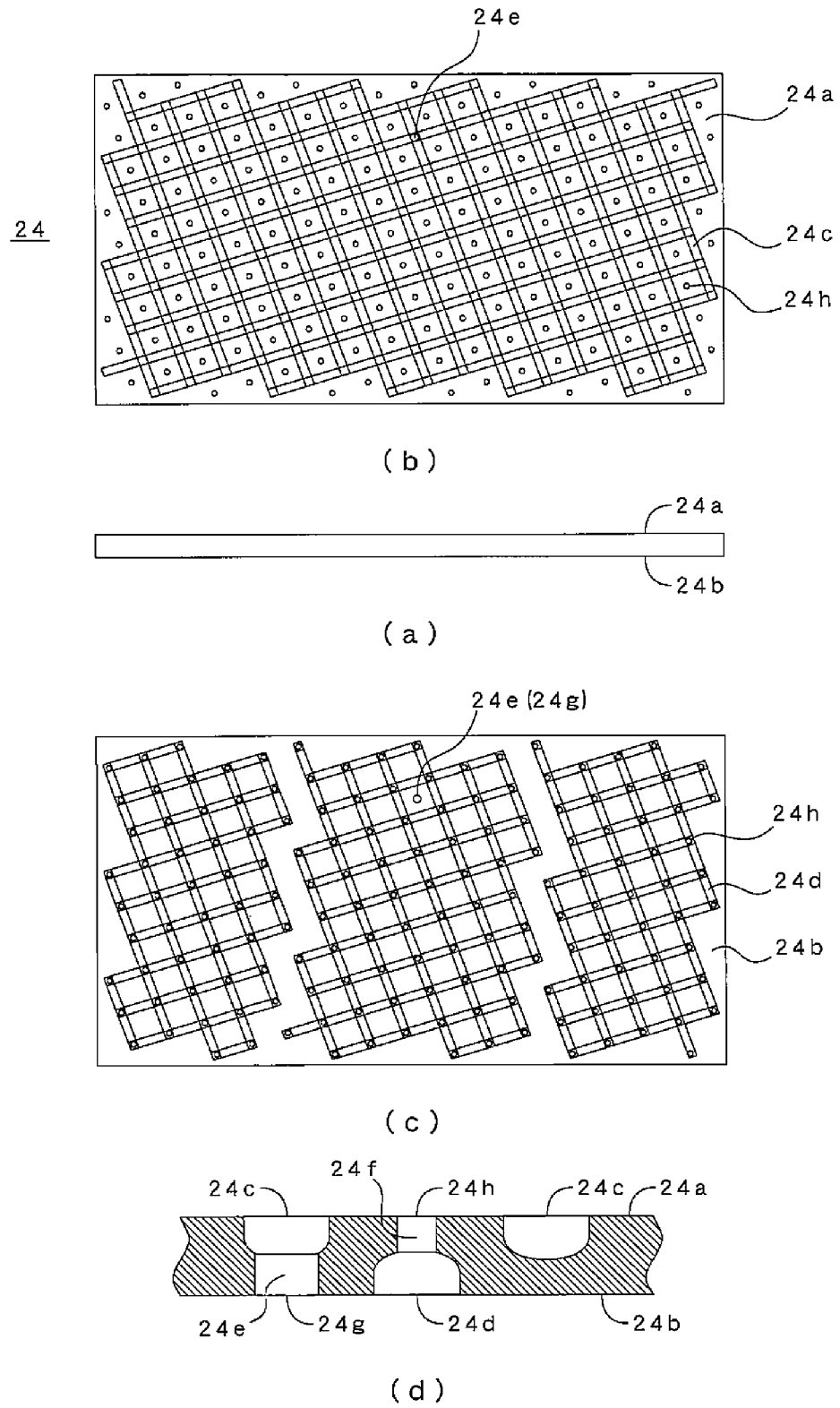
FIG. 1 depicts a levitation air plate according to the first embodiment of the present invention, in which (a) is a front view, (b) is a top view, and (c) is a bottom view.

FIG. 1 shows a levitation air plate according to the first embodiment of the present invention, and this levitation air plate 1 is composed of a top plate 2, in which a plurality of air ejection holes 2c (described with white circles) and suction holes 2d (described with black circles) are arranged in alternating fashion on the upper surface thereof; an orifice sheet 3 positioned under the top plate 2; an air route plate 4 positioned under the orifice sheet 3, and a bottom plate 5 that is positioned under the air route plate 4 and is provided with an air supply hole 5c and a suction hole 5d.

Figure 2:
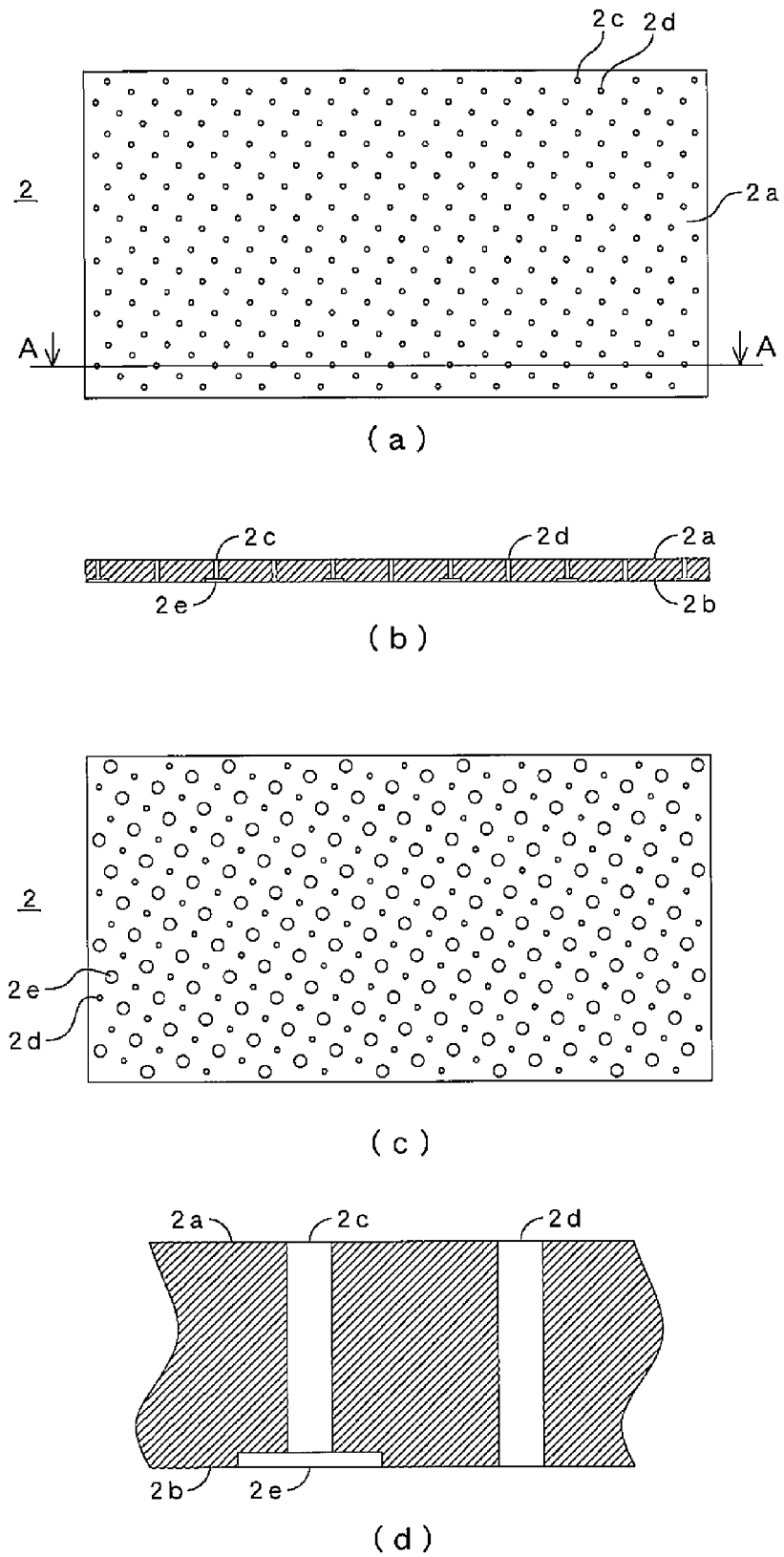
FIG. 2 depicts a top plate of the levitation air plate shown in FIG. 1, in which (a) is a top view, (b) is a cross-sectional view taken along the line A-A of (a) and, (c) is a bottom view, and (d) is an enlarged cross-sectional view of a counter-bored portion and its periphery.

Surfaces of the top plate 2 are ground with high accuracy, and the top plate 2 is, as shown in FIG. 2, provided with the plurality of air ejection holes 2c and suction holes 2d penetrating from an upper surface 2a to a lower surface 2b arranged in alternating fashion. On the lower surface 2b side of each air ejection hole 2c is formed a counterbored portion 2e. The air ejection hole 2c is approximately 2.5 mm in diameter, and the counterbored portion 2e is 0.1 mm to 0.2 mm in depth, and approximately 8 mm in diameter. The suction hole 2d is formed to have the same inner diameter over the full length.

Figure 3:
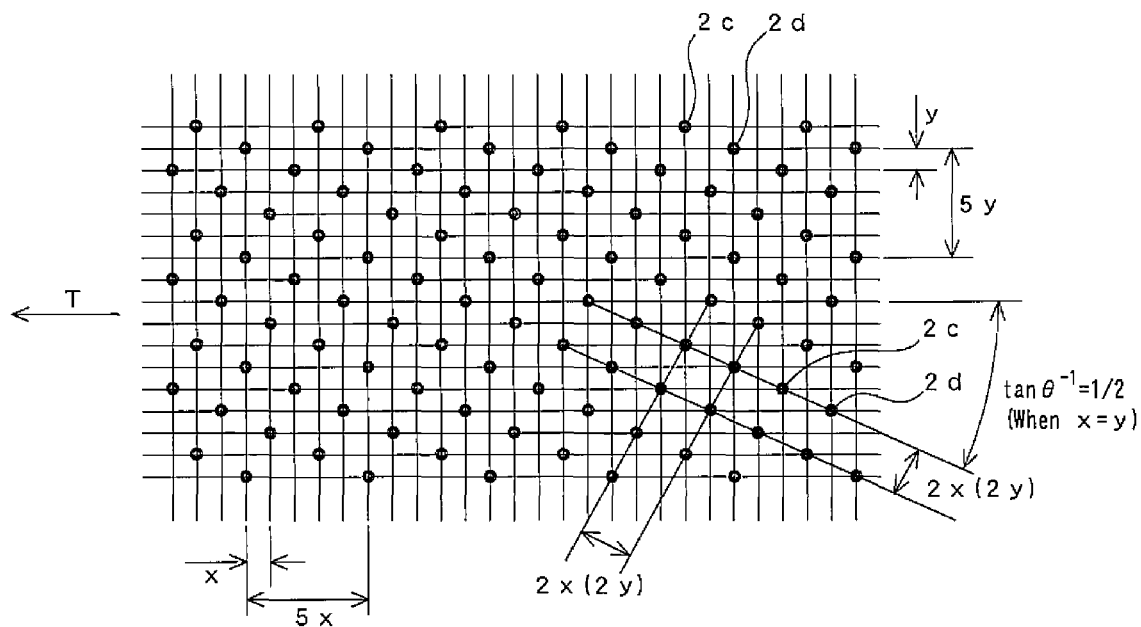
FIG. 3 is a top view showing an example of arrangement design of air ejection holes and suction holes of the top plate shown in FIG. 2.

FIG. 3 shows an example of arrangement design of the air ejection holes 2c and the suction holes 2d. As shown in the figure, the air ejection holes 2c and the suction holes 2d are alternately disposed on cross points of a lattice. The positions of the air ejection holes 2c and the suction holes 2d are determined by the nominal size of the plate, and when a glass of 0.7 mm thickness is conveyed, approximately 10 mm and approximately X=Y are adopted. Pitches of the air ejection holes 2c and the suction holes 2d are set in accordance with the thickness of a glass or the like to be conveyed. It is economically preferable that when a thin glass or the like is conveyed the pitches are set to be narrow, and when a thick glass or the like is conveyed the pitches are set to be wide.

Figure 4:
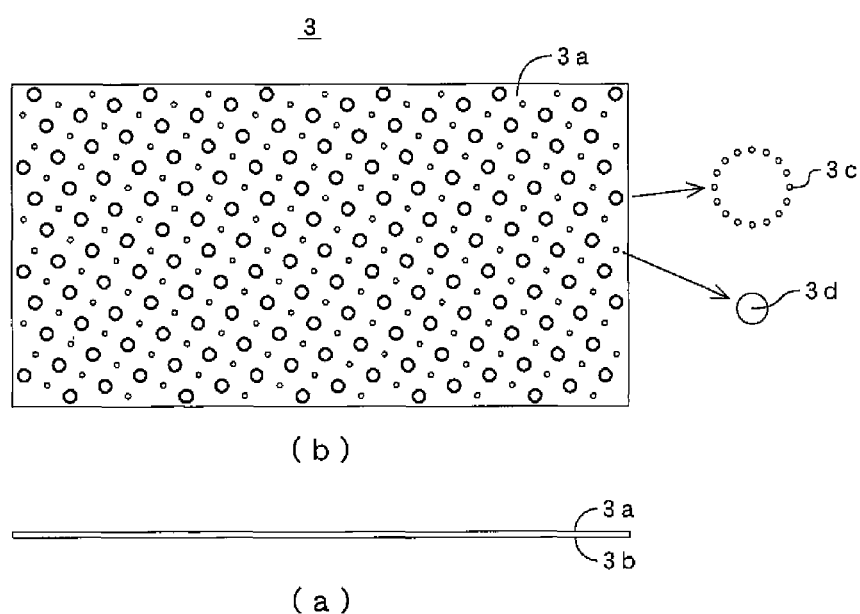
FIG. 4 depicts an orifice sheet of the levitation air plate shown in FIG. 1, in which (a) is a front view, (b) is a top view.

As shown in FIG. 4, the orifice sheet 3 is provided with a set (16 in this embodiment) of orifices 3c penetrating from an upper surface 3a to a lower surface 3b at positions corresponding to the counter-bored portions 2e of the top plate 2, and communicating holes 3d communicating with the suction holes 2d of the top plate 2 and penetrating from the upper surface 3a to the lower surface 3b.

The orifice 3c is a micropore of approximately 0.03-0.05 mm as a throttle hole, and for example, a plurality of the orifices 3c are provided like islands along the circumference of a circle of 6 mm in diameter though a stainless steel sheet of approximately 0.3 mm in thickness with laser processing or the like. Airs passing through the orifice sheet 3 display throttling effect to give rigidity to a floating glass.

Figure 7:
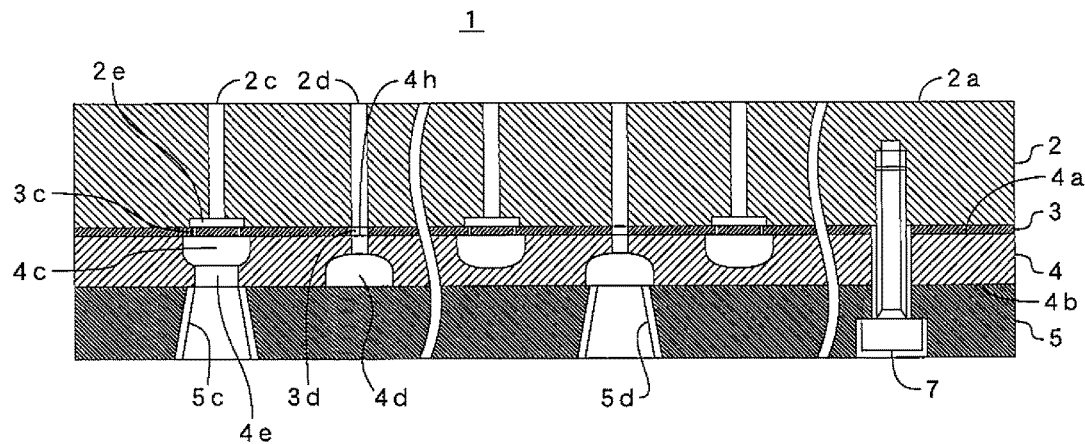
FIG. 7 is a cross-sectional view of the levitation air plate shown in FIG. 1.

As shown in FIG. 5, the air route plate 4 is provided with air ejecting channel portions 4c on an upper surface 4a, and suction channel portions 4d on a lower surface 4b. The air ejecting channel portions 4c are in communicating with an air ejecting opening portion 4g via a communicating hole 4e, and the suction channel portions 4d are in communicating with suction opening portions 4h via communicating holes 4f. As shown in FIG. 7, when the orifice sheet 3 positions on the upper surface 4a of the air route plate 4, the air ejecting channel portions 4c communicate with all of the orifices 3c of the orifice sheet 3, and each of the suction opening portions 4h communicates with each communicating hole 3d of the orifice sheet 3 one to one. In addition, all of the suction opening portions 4h communicate with the suction channel portions 4d.

Figure 6:
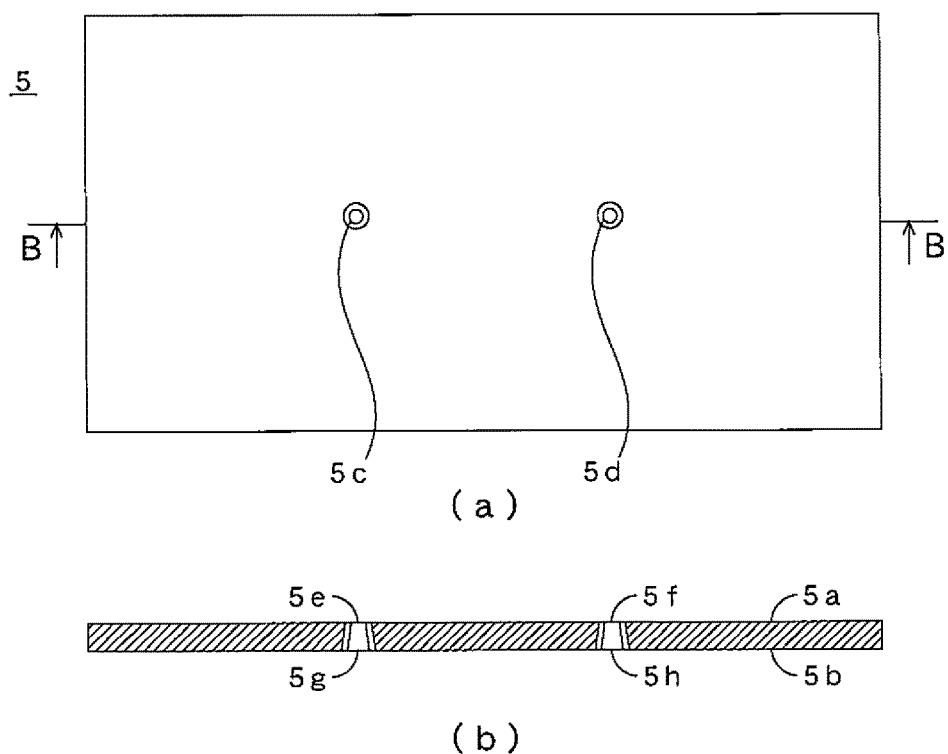
FIG. 6 depicts a bottom plate of the levitation air plate shown in FIG. 1, in which (a) is a top view, (b) is a cross-sectional view taken along the line B-B of (a).

As shown in FIG. 6, the bottom plate 5 is provided with an air supply hole 5c and a suction hole 5d that penetrate from an upper surface 5a to a lower surface 5b thereof. An upper side opening portion 5e of the air supply hole 5c communicates with the communicating hole 4e that is in communication with the air ejecting channel portions 4c of the air route plate 4, and an upper side opening portion 5f of the suction hole 5d communicates with the suction channel portions 4d of the air route plate 4. Like this, the bottom plate 5 functions as a lid of the suction channel portions 4d of the air route plate 4. A lower side opening portion 5g of the air supply hole 5c and a lower side opening portion 5h of the suction hole 5d of the bottom plate 5 are connected with an air feed pipe, and a vacuum suction pipe and a vacuum pump respectively.

The top plate 2 to the bottom plate 5 are stuck as shown in FIG. 7, and are combined with an assembling bolt 7.

Next, the motion of the levitation air plate 1 with the above-mentioned construction will be explained mainly with reference to FIG. 7.

A compressed air fed from the air supply hole 5c of the bottom plate 5 enters the air ejecting channel portions 4c of the air route plate 4, and reaches to the plurality of orifices 3c, which are dotted like islands, of the orifice sheet 3 to display throttling effect, and airs ejected from the orifices 3c collide with the counter-bored portion 2e of the top plate 2, and then pass through a gap with a seat face and are blown from the air ejection hole 2c of approximately 2.5 mm in diameter toward a glass or the like with lowered speed. With this, it is possible to float the glass or the like above the upper surface 2a in noncontact state while maintaining its high rigidity.

In addition, an air sucked from the suction hole 2d of the top plate 2 passes through the communicating hole 3d of approximately 2.5 mm in diameter of the orifice sheet 3, the suction channel portions 4d, which are formed on the lower surface of the air route plate 4 like a lattice, and the suction hole 5d of the bottom plate 5, and finally discharged to the vacuum pump.

Figure 8:
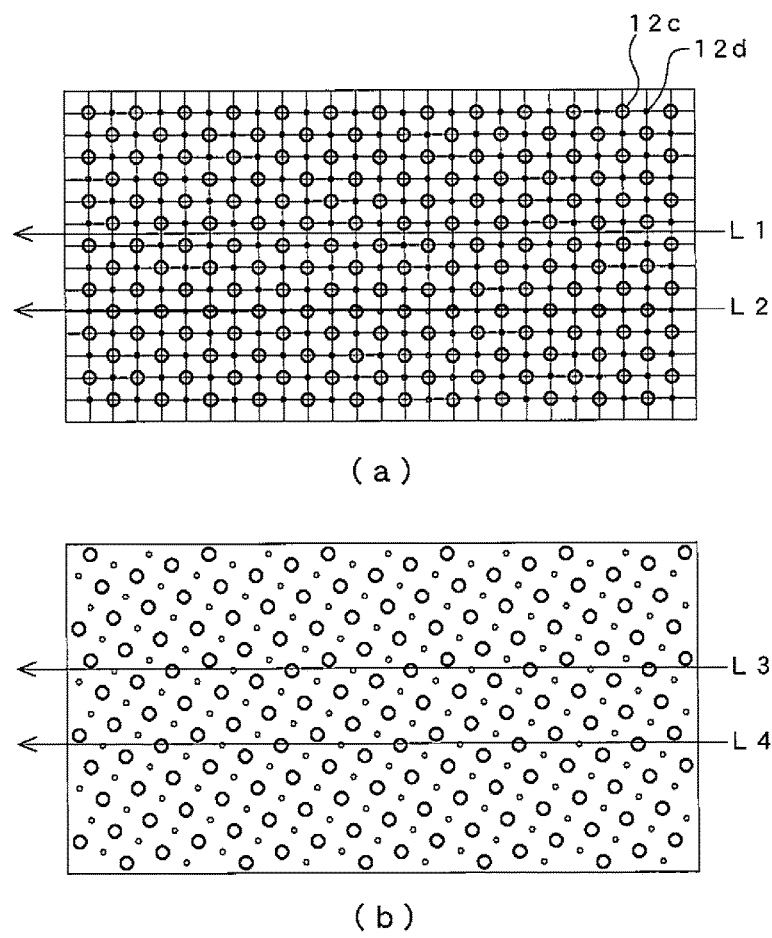
FIG. 8 is top views for explaining procedures of conveying a glass or the like with levitation air plates, in which (a) shows a conventional method, and (b) shows a method according to the first embodiment of the present invention.

FIG. 8 includes drawings for explaining procedures for conveying the glass or the like by using levitation air plates, and in a conventional levitation air plate shown in (a), air ejection holes 12c and suction holes 12d are alternately disposed on intersections of perpendicularly crossing lines, so that on a conveying line L1 does not position the glass or the like immediately above the air ejection holes 12c and the suction holes 12d, but on a conveying line L2 positions the glass or the like immediately above the air ejection holes 12c and the suction holes 12d. In these manners, between the conveying lines L1 and L2, floating forces and suction forces against the glass or the like are remarkably different from each other, so that the glass or the like cannot be conveyed in stable temperature condition and in noncontact state.

On the other hand, in the first embodiment of the present invention, as shown in FIG. 3, angles between a plurality of lines that pass through the air ejection holes 2c and the suction holes 2d and the conveying direction T by the levitation air plate are set to be approximately 30°, so that as shown in FIG. 8(b), like conveying lines L3 and L4, when the glass or the like passes any line, the entire surface of the glass or the like evenly positions immediately above the air ejection holes 2c and the suction holes 2d, so that floating forces and suction forces can evenly be given to the glass or the like, which allows the glass or the like to stably be conveyed in noncontact state. In this connection, the angles between the plurality of lines that pass through the air ejection holes 2c and the suction holes 2d and the conveying direction T by the levitation air plate in FIG. 3 are not limited to approximately 30°, but angles other than 0°, 45° and 90° allow, as described above, the entire surface of the glass or the like to evenly position immediately above the air ejection holes 2c and the suction holes 2d, resulting in stable conveyance in noncontact state.

The levitation air plate 1 according to the first embodiment of the present invention is characterized, as the first characteristic, by having the top plate 2, which has a plurality of air ejection holes 2c and suction holes 2d penetrating from the upper surface 2a to the lower surface 2b are arranged in alternating fashion as viewed from the upper surface 2a, and has the counter-bored portion 2e on the lower surface side of each of the plurality of air ejection holes 2c as shown in FIG. 2, and the orifice sheet 3, which has a plurality of orifices 3c penetrating from the upper surface 3a to the lower surface 3b in positions corresponding to the counter-bored portions 2e of the top plate 2, and has the communicating holes communicated one-to-one with the suction holes 2d of the top plate 2 and penetrating from the upper surface 3a to the lower surface 3b as shown in FIGS. 4, 7, and it is preferable to use the air route plate 4 and the bottom plate 5 due to a variety of advantages, but the present invention is not limited to those, and it is possible to use, on the bottom side, any plate with such construction as to enable to feed airs to all of the orifices 3c drilled in the orifice sheet 3 and to suck airs from all of the communicating holes of the orifice sheet 3 in communication with the suction holes 2d.

Next, an example of the levitation air plate according to the first embodiment of the present invention will be explained.

As described above, in order to sustain the glass floating with air in high accuracy, it is required to arrange the air ejection holes 2c (refer to FIG. 2) having the orifice 3c with throttling effect (refer to FIG. 4) below, and the suction holes 2d in alternating fashion to give the floating glass a high rigidity. For example, in case of conveying a glass (2,200× 2,500×t) of G8 size, the orifices 3c of 0.05 mm in diameter are arranged approximately 60,000, the air ejection holes 2c of 2.5 mm in diameter are arranged approximately 3,000, and the suction holes 2d of 2.5 mm in diameter are arranged approximately 3,000 in design.

As the orifices 3c with throttling effect, holes of 0.05 mm in diameter are drilled 60,000 in a stainless steel sheet of 0.3 mm in thickness. In this case, using laser processing or the like remarkably shortens a time required for the processing.

On the other hand, a time required to drill 60,000 holes of 0.05 mm in diameter in a stainless steel sheet of approximately 10 mm in thickness with a drill is 60,000 minutes (more or equal to 1 minute to drill a hole), that is 40 days or more, so that it is impossible to adopt the processing with a drill in consideration of the life of the drill.

In the first embodiment of the present invention, forming many micropores through the thin (for example 0.3 mm) orifice sheet 3 can avoid forming micropores (for example 0.05 mm) through the thick (for example 10 mm) plate such as the top plate 2, and it is enough to form holes of approximately 2.5 mm in diameter to the thick plate.

In case that the diameter of the air ejection hole is 0.05 mm, under a condition that air feed pressure is 10 kPa, and a floatation amount is 0.25 mm, the velocity of an ejected air is calculated to be 76.8 msec. However, in the first embodiment of the present invention, the velocity of airs colliding with the air ejection hole 2c formed on the lower surface 2b of the top plate 2, passing through a gap and blown from the air ejection hole 2c is decreased to approximately 20 m/sec, which considerably reduces generation of static electricity caused by airs colliding with a glass or the like.

In addition, in the first embodiment of the present invention, when a floatation amount is 20 mm, the velocity of the air becomes 1 m/sec or less, which does not provide disorder influences due to disturbances to down streams from a ceiling in clean rooms. On the contrary, under a condition that the diameter of the air ejection hole is 0.1 mm, an air feed pressure is 10 kPa, a floatation amount of the glass is 0.25 mm, the velocity of the air becomes 95 m/sec, which generates static electricity, so that it becomes necessary to tackle it. And, it becomes a factor of disturbances to down streams from a ceiling in clean rooms.

Next, a levitation air plate according to the second embodiment of the present invention will be explained while referring drawings.

FIG. 9 shows a levitation air plate according to the second embodiment of the present invention, and this levitation air plate 21 is composed of a top plate 22, in which a plurality of air ejection holes 22c (described with white circles) and suction holes 22d (described with black circles) are arranged in alternating fashion on the upper surface thereof; a seat face sheet 26 positioned under the top plate 22; an orifice sheet 23 positioned under the seat face sheet 26; an air route plate 24 positioned under the orifice sheet 23, and a bottom plate 25 that is positioned under the air route plate 24 and is provided with an air supply hole 25c and suction holes 25d.

Figure 10:
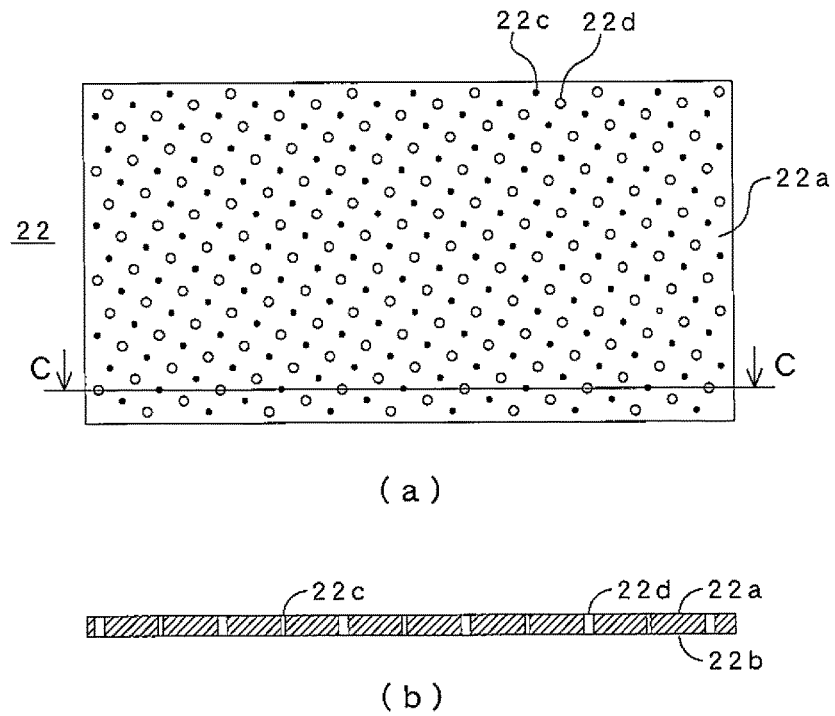
FIG. 10 depicts a top plate of the levitation air plate shown in FIG. 9, in which (a) is a top view, (b) is a cross-sectional view taken along the line C-C of (a).

As shown in FIG. 10, the top plate 22 is, like the top plate 2 in the first embodiment, provided with the plurality of air ejection holes 22c and suction holes 22d penetrating from an upper surface 22a to a lower surface 22b arranged in alternating fashion. The arrangements of the air ejection holes 22c and the suction holes 22d are the same as those of the first embodiment shown in FIG. 3, and the diameters of the air ejection hole 22c and the suction hole 22d are set to be approximately 2.5 mm and 4.0 mm respectively.

Figure 11:
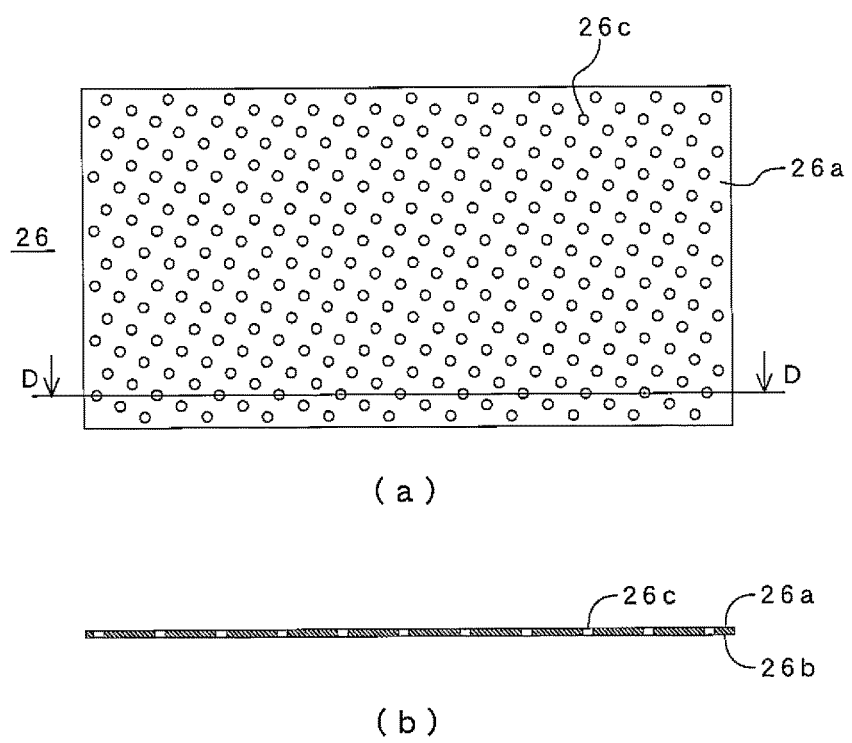
FIG. 11 depicts a seating face sheet of the levitation air plate shown in FIG. 9, in which (a) is a top view, (b) is a cross-sectional view taken along the line D-D of (a).

As shown in FIG. 11, the seat face sheet 26 is provided with communicating holes 26c penetrating from an upper surface 26a to a lower surface 26b at positions corresponding to the air ejection holes 22c and the suction holes 22d. The communicating holes 26c are used to guide airs ejected from air ejecting orifice portions 23d of the orifice sheet 23 described below in a horizontal direction, and have a larger diameter than those of the air ejection holes 22c and the suction holes 22d. For example, when the thickness of the seat face sheet 26 is approximately 0.15 mm to 0.3 mm, the diameter of the communicating holes 26c is set to be approximately 8 mm. Setting the diameter of the communicating holes 26c in this manner is effective in throttling of airs and reduction in ejecting velocity of the airs.

In this manner, enlarging the diameter of the communicating holes 26c arranged in the seat face sheet 26 than those of the air ejection holes 22c and the suction holes 22d allows the counter-bored portions 2e provided in the top plate 2 in the first embodiment to be formed when the top plate 22 and the seat face sheet 26 are stuck.

With this, it becomes possible to improve accuracy in counter-bore drilling in a large top plate, a side of which beyond 2500 mm, such as a LCD panel for TV (Television set), and to obtain uniform counter-bored depth with easy processing.

Figure 12:
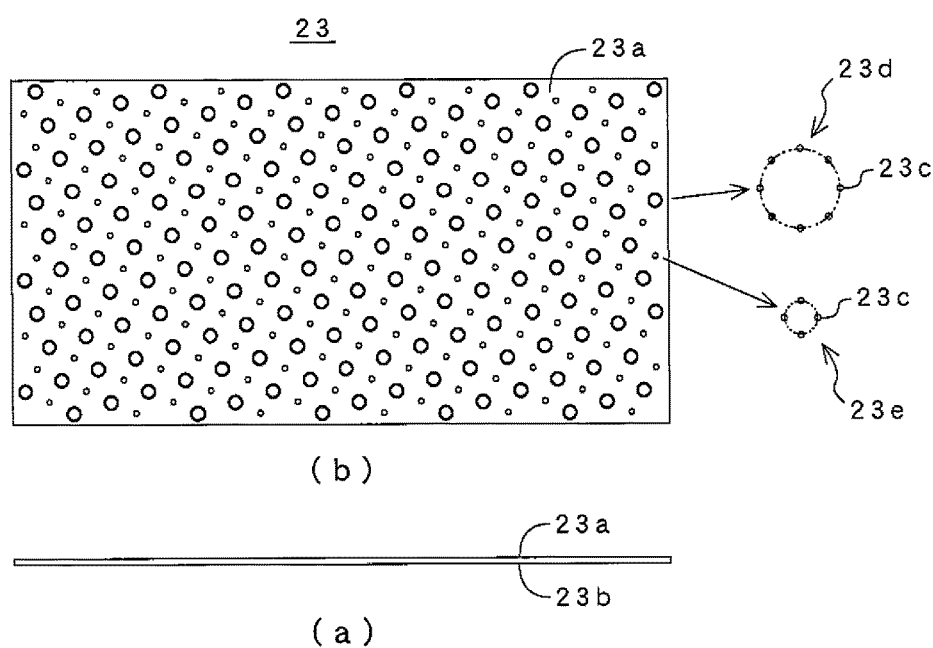
FIG. 12 depicts an orifice sheet of the levitation air plate shown in FIG. 9, in which (a) is a front view, and (b) is a top view.

As shown in FIG. 12, the orifice sheet 23 is provided with air ejecting orifice portions 23d penetrating from an upper surface 23a to a lower surface 23b, each of which consists of a set (eight in this embodiment) of orifices 23c, at positions corresponding to the air ejection holes 22c of the top plate 22, and suction orifice portions 23e penetrating from the upper surface 23a to the lower surface 23b, each of which consists of a set (four in this embodiment) of orifices 23c, at positions corresponding to the suction holes 22d of the top plate 22.

The orifices 23c are micropores of approximately 0.03 to 0.10 mm in diameter as throttle holes for airs, for example, a plurality of the orifices 23c are provided like islands along the circumference of a circle of predetermined diameter though a stainless steel sheet of approximately 0.15 mm to 0.3 mm in thickness with laser processing or the like. For example, in the air ejecting orifice portions 23d are provided four to eight orifices 23c along the circumference of a circle of approximately 6 mm in diameter, and in the suction orifice portions 23e are provided three to six orifices 23c along the circumference of a circle of approximately 3 mm in diameter.

Airs passing through the orifice sheet 23 display throttling effect to give rigidity to a floating glass. And, providing the orifices 23c on the suction side also display throttling effect to airs to be sucked, which can reduce change in sucking force.

As shown in FIG. 13, the air route plate 24 is, in the same manner as the air route plate 4 in the first embodiment, provided with air ejecting channel portions 24c on an upper surface 24a, and suction channel portions 24d on a lower surface 24b, and the air ejecting channel portions 24c are in communicating with an air ejecting opening portion 24g via a communicating hole 24e, and the suction channel portions 24d are in communicating with suction opening portions 24h via communicating holes 24f.

Figure 15:
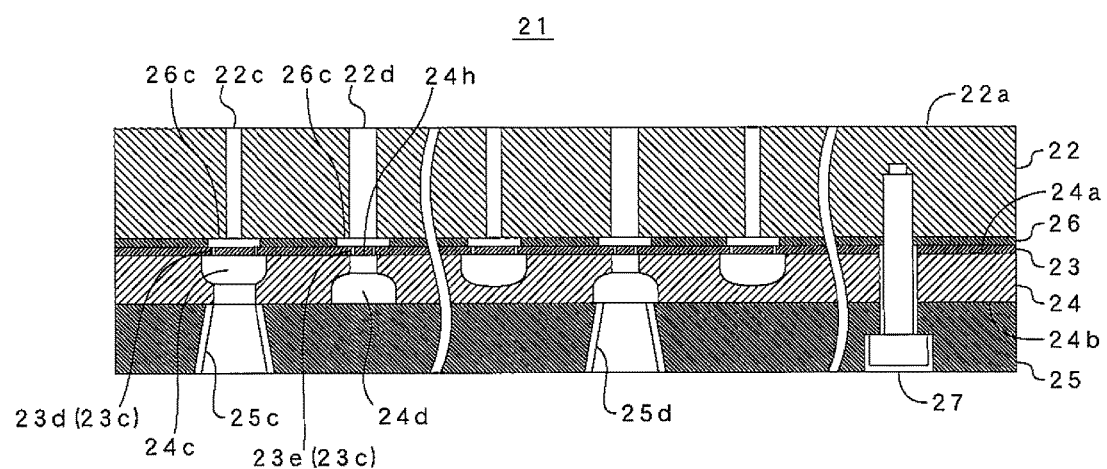
FIG. 15 is a cross-sectional view of the levitation air plate shown in FIG. 9.

As shown in FIG. 15, when the orifice sheet 23 positions on the upper surface 24a of the air route plate 24, the air ejecting channel portions 24c communicate with all of the orifices 23c of the air ejecting orifice portions 23d of the orifice sheet 23, and each of the suction opening portions 24h communicates with all of the orifices 23c of the suction orifice portions 23e of the orifice sheet 23. In addition, all of the suction opening portions 24h communicate with the suction channel portions 24d.

In this example, in order to suppress the change in floatation amounts when conveying a glass or the like, the suction channel portion 24d is divided into three such that air routes are independently arranged in a direction that the glass or the like is conveyed. However, the suction channel portion 24d is not limited to this, and it can be divided into more than three, and in the same manner as the first embodiment, the suction channel portion 24d may be constructed so as not to be divided.

As shown in FIG. 14, the bottom plate 25 is, in the same manner as the bottom plate 5 in the first embodiment, provided with an air supply hole 25c and suction holes 25d that penetrate from an upper surface 25a to a lower surface 25b. An upper side opening portion 25e of the air supply hole 25c communicates with a communicating hole 24e communicating with the air ejecting channel portions 24c of the air route plate 24, and upper side opening portions 25f of suction holes 25d communicate with the suction channel portion 24d of the air route plate 24. Like this, the bottom plate 25 functions as a lid of the suction channel portions 24d of the air route plate 24.

A lower side opening portion 25g of the air supply hole 25c and a lower side opening portion 25h of the suction hole 25d of the bottom plate 5 are connected with an air feed pipe, and a vacuum suction pipe and a vacuum pump respectively.

The top plate 22 to the bottom plate 25 are stuck as shown in FIG. 15, and are combined with an assembling bolt 27.

Next, the motion of the levitation air plate 21 with the above-mentioned construction will be explained mainly with reference to FIG. 15.

A compressed air fed from the air supply hole 25c of the bottom plate 25 enters the air ejecting channel portions 24c of the air route plate 24, and reaches to the plurality of orifices 23c (air ejecting orifice portions 23d), which are dotted like islands, of the orifice sheet 23 to display throttling effect, and airs passing through the communicating holes 26c of the seat face sheet 26 collide with the bottom face of the top plate 22, and then pass through a gap with a seat face and are blown from the air ejection hole 22c of approximately 2.5 mm in diameter toward a glass or the like with lowered speed. With this, it is possible to float the glass or the like above the upper surface 22a in noncontact state while maintaining its high rigidity.

In addition, airs sucked from the suction holes 22d of the top plate 22 pass through the communicating holes 26c of the seat face sheet 26, and reach to the plurality of orifices 23c (suction orifice portions 23e), which are dotted like islands, of the orifice sheet 23 to display throttling effect, and airs pass through the suction hole 25d of the bottom plate 25 via the suction channel portions 24d, which are formed on the lower surface of the air route plate 24 like a lattice, and the suction hole 25d of the bottom plate 25, and finally discharged to the vacuum pump.

The motion of the levitation air plate 21 as described above enables stable conveyance in noncontact state like the first embodiment.

As described above, in the second embodiment, the top plate 22, in which the air ejection holes 22c and the suction holes 22d are drilled, and the seat face sheet 26, in which the communicating holes 26c having larger diameter than those of the air ejection holes 22c and the suction holes 22d are drilled, are stuck to form the top plate 2 according to the first embodiment, so that the counter-bored portions 2e of the top plate 2 according to the first embodiment can be formed independently on the seat face sheet 26, which can increase accuracy of counter-boring; obtain uniform depth of the counter-bore; and perform the counter-boring with ease.

The first and second embodiments of the present invention are explained above, the present invention is not limited to the first and second embodiments, and various variations and practical applications should be possible within the scope of the present invention. For example, in the first embodiment, the communicating holes 3d are drilled in the orifice sheet 3 to suck air, it is not limited to this, in the same manner as the second embodiment, a set of orifices 3c dispose like islands can be drilled. And, for instance, in the second embodiment, in place of the suction orifice portion 23e, in the same manner as the first embodiment, the communicating holes can be drilled.

In addition, for example, in the first embodiment, the suction channel portion 4d formed on the lower surface 4b of the air route plate 4 can be divided, in the same manner as the second embodiment, in a direction that a glass or the like is conveyed.

DESCRIPTION OF THE REFERENCE NUMBERS 1, 21 levitation air plates
2, 22 top plates
2a, 22a upper surfaces
2b, 22b lower surfaces
2c, 22c air ejection holes
2d, 22d suction holes
2e counter-bored portions
3, 23 orifice sheets
3a, 23a upper surfaces
3b, 23b lower surfaces
3c, 23c orifices 3d communicating holes
4, 24 air route plates
4a, 24a upper surfaces
4b, 24b lower surfaces
4c, 24c air ejecting channels
4d, 24d suction channel portions
4e, 24e communicating holes
4f, 24f communicating holes
4g, 24g air ejecting opening portions
4h, 24h suction opening portions
5, 25 bottom plates
5a, 25a upper surfaces
5b, 25b lower surfaces
5c, 25c air supply holes
5d, 25d suction holes
5e, 25e upper side opening portions
5f, 25f upper side opening portions
5g, 25g lower side opening portions
5h, 25h lower side opening portions
7, 27 assembling bolts
23d air ejecting orifice portions
23e suction orifice portions
26 seating face sheet
26a upper surface
26b lower surface
26c communicating holes

The invention claimed is:

1. A levitation air plate comprising:
    a top plate in which a plurality of air ejection holes and suction holes penetrating from an upper surface to a lower surface thereof are arranged in alternating fashion as viewed from the upper surface;
    a seating face sheet having communicating holes communicated one-to-one with the air ejection holes and the suction holes of the top plate, and penetrating from an upper surface to a lower surface thereof, and whose diameters are larger than diameters of the air ejection holes and suction holes;
    an orifice sheet having a plurality of first orifices penetrating from an upper surface to a lower surface thereof in positions corresponding to the communicating holes of the seating face sheet communicated with the air ejection holes of the top plate, and having a plurality of second orifices penetrating from the upper surface to the lower surface thereof in positions corresponding to the communicating holes of the seating face sheet communicated with the suction holes of the top plate;
    a bottom side plate having an air supply route and an air supply hole for supplying air to all of the first orifices drilled in the orifice sheet, and having an air suction route and a suction hole for suctioning air from all of the second orifices drilled in the orifice sheet.

2. The levitation air plate as claimed in claim 1, wherein said bottom side plate comprises:
    an air route plate having, on an upper surface thereof, air ejecting channel portions that communicate with all of the first orifices drilled in the orifice sheet and suction openings that communicate with all of the second orifices drilled in the orifice sheet; and having, on a lower surface thereof, suction channel portions that communicate with all of the communicating holes communicating with the suction openings; and having a communicating hole that opens on the lower surface and communicates with the air ejecting channel portions; and
    a bottom plate having an air supply hole and a suction hole that penetrate from an upper surface to an lower surface thereof, an opening portion on the upper surface side of the air supply hole communicating with the communicating hole that communicates with the air ejecting channel portions of the air route plate, and an opening portion on the upper surface side of the suction hole communicating with the suction channel portions of the air route plate.

3. The levitation air plate as claimed in claim 1, wherein said air ejection holes and the suction holes of the top plate are arranged in alternating fashion on a plurality of lines that never cross each other as viewed from the upper surface, and angles between the plurality of lines and a conveying direction by the levitation air plate are other than 0°, 45° and 90°.

4. The levitation air plate as claimed in claim 2, wherein said air ejection holes and the suction holes of the top plate are arranged in alternating fashion on a plurality of lines that never cross each other as viewed from the upper surface, and angles between the plurality of lines and a conveying direction by the levitation air plate are other than 0°, 45° and 90°.

* * * * *